United States Patent [19]
Kirby et al.

[11] Patent Number: 5,468,345
[45] Date of Patent: Nov. 21, 1995

[54] METHOD OF MAKING A HIGH-DEFINITION PRINTED CIRCUIT

[76] Inventors: Ronald K. Kirby; James W. Watson, both of 11060 NW. 28th St., Coral Springs, Fla. 33065

[21] Appl. No.: 237,835

[22] Filed: May 4, 1994

[51] Int. Cl.⁶ .............................. B44C 1/22; C23F 1/02
[52] U.S. Cl. ................... 216/51; 216/48; 216/52; 216/105
[58] Field of Search .................... 430/313, 318; 829/846; 156/645, 656, 659.1, 666, 901, 902

[56] References Cited

U.S. PATENT DOCUMENTS

| 4,444,619 | 4/1984 | O'Hara | 156/645 |
| 5,242,540 | 9/1993 | Ishii et al. | 156/645 |

Primary Examiner—William Powell
Attorney, Agent, or Firm—Aubrey J. Dunn

[57] ABSTRACT

A method of making printed circuit boards in a continuous process. The method uses copper base metal sputtered onto a substrate. This base metal is much thinner than the base metal normally used in printed circuit processes and ultimately allows a greater number of conductors per unit of length to be made on the boards.

4 Claims, 1 Drawing Sheet

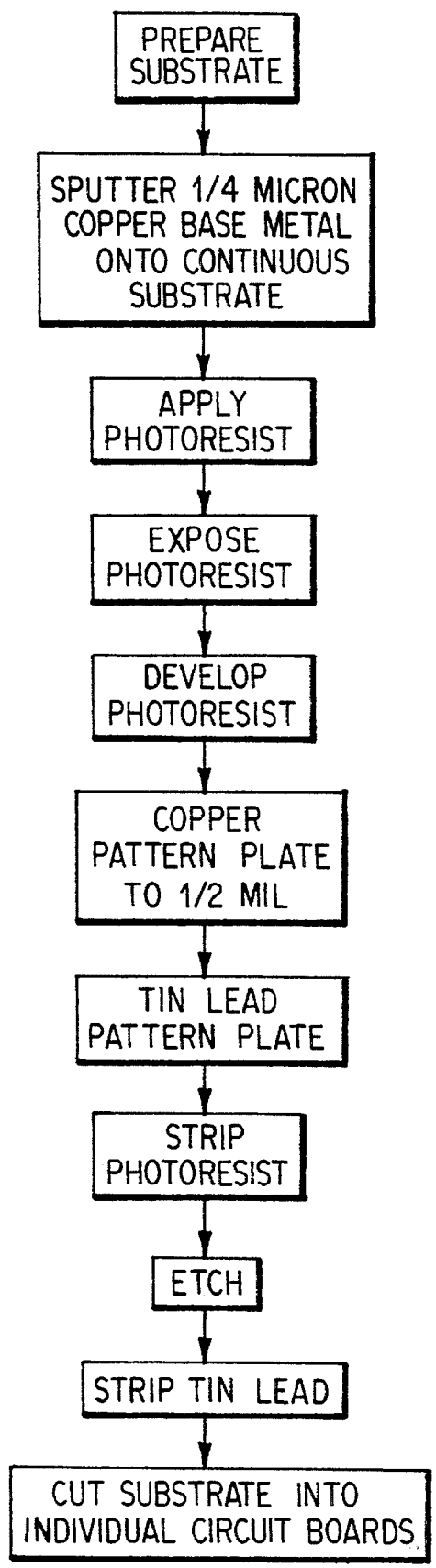

METHOD OF MAKING A HIGH-DEFINITION PRINTED CIRCUIT

BACKGROUND OF THE INVENTION

This invention is in the field of electrical printed circuits. Such circuits are well known nowadays and used extensively in many electrical devices, ranging from such products as household appliances to space vehicles. As the technology of printed circuits has matured, it has become possible to make such circuits with smaller and more closely spaced conductors and yet to improve longevity and reliability. It is currently possible to make such conductors with widths of 5 mils and with 5 mil spacings between the conductors. A standard batch method of making printed circuit boards currently in use begins with a glass laminate material such as FR-4, precut to panel size. The first step of the method is mechanically cladding one or both sides of the board with copper base metal foil on the order of 1 mil thick. The foil is then electroplated with an additional 1 mil layer of copper called panel plate. If any through holes are needed for the particular circuit being made, they are made at this time. Next, a layer of photoresist is deposited, exposed through a mask with the desired pattern, and developed to remove the unexposed portions from the panel plate and consequently to bare portions of the panel plate. These bare portions are then sequentially plated with a copper pattern plate about ½ mil thick and with tin-lead pattern plate about ½ mil thick. The photoresist is then stripped and the board is placed in an etchant intended to remove those portions of the copper base cladding foil not covered by the copper pattern layer and the tin-lead plate. The remaining portions of pattern plate and base copper form the conductors of the board. An alternative embodiment performs reflow of the tin-lead pattern plate as a last major step. Obviously, undercutting by the etchant occurs on both the copper base and pattern plate. Considering the thickness of the base, this undercutting limits the minimum conductor width that can be made. The use of a batch method such as this obviously requires sequential steps and is relatively labor intensive. The instant invention is intended as a continuous process, i.e., its substrate is not precut, but is cut only after all the other process steps are completed. Moreover, because of its unique process, the instant invention allows conductor widths and spacings between conductors to be made on the order of 2 mils.

SUMMARY OF THE INVENTION

This invention is a method of making a printed circuit wherein conductor widths with spacings between conductors is ½ or less than currently routinely productible. The method is similar to the prior art methods described above but differs in that it used a sputtered base metal much thinner than that normally used, and it omits the panel plating step, and because of its thinner base metal layer, a much less aggressive etchant is usable.

An object of this invention is to provide a method of making printed circuit boards that allows much smaller conductor widths and spacings than has been heretofore possible.

Another object is to provide such a method that allows continuous processing of such boards rather than the batch processing of the prior art.

BRIEF DESCRIPTION OF THE INVENTION

The single drawing figure is a flow elton for the inventive method.

DETAILED DESCRIPTION OF THE INVENTION

This invention may perhaps be best understood when this description is taken in conjunction with the drawing flow chart. The initial step, as in any method of making a printed circuit, is preparation of the substrate. In our invention, our preferred substrate is a 2 mil polyimide strip (known as Kapton) taken from a continuous roll. This strip is sputtered with a ¼ micron copper base metal, whereas the prior art method described in the Background of the Invention clads a 1 mil copper base metal onto its board. The thinness of our base metal is what makes possible the small conductor widths and spacings (about 2 mils) of this invention. The next three steps are concerned with the known steps of applying a photoresist, exposing this photoresist through a mask which defines the desired circuit on the substrate, and developing the photoresist to expose portions of the base metal. These exposed portions are sequentially copper pattern plated with about ½ mil of copper (as opposed to 1 mil in the above described prior art method) and are tin-lead pattern plated atop the copper pattern plate. The next steps are stripping of the photoresist and etching away the exposed ¼ micron copper base metal. Since this base metal is much thinner that the prior an base metal, it may be removed with a less aggressive etchant, i.e., an etchant with a less molar strength than the prior art etchants. In particular, our etchant has a molar strength ¼ or less of the prior an etchants. Even with this less aggressive etchant, the time needed to etch away the exposed base metal, because of its thickness is less than the time required to etch away the prior an base metal. Moreover, the use of a less aggressive etchant (together with decreased etching time) reduces undercutting of both the base metal and the pattern plate to an insignificant amount. The result is that the sides of the conductors are essentially straight and perpendicular to the substrate. Further, a less aggressive etchant is less environmentally hazardous and is thus much easier to dispose of when depleted.

After etching is complete and the usual rinsing and drying are done (not shown in the flow chart), the tin-lead pattern plate is stripped. The final step is to cut the substrate into individual circuit boards.

It should be mentioned that the use of sputtering for depositing copper onto printed circuit boards is not unique to this inventive method, but has had limited use before now. In particular, sputtering is used with Tape Automated Bonding (TAB) circuits and in special or custom applications. It has not been used in the normal printed circuit board processes such as the one described above in the prior art.

Further, although we teach that we strip the tin-lead pattern, we could instead reflow it to leave a good solderable surface on the conductors.

It may occur to one to wonder whether our use of thinner layers of copper is detrimental to circuit operation. In particular, are our conductors capable of safely carrying expected circuit currents? The answer to this is "yes", since the prior art conductors have much more copper than is necessary for most printed circuit systems. Our conductors are easily able to carry most currents in logic circuits using TTL, CMOS, or NMOS devices. For circuits which may use higher currents, we may increase the thickness of our pattern plate as required, but the process will otherwise be the same.

It should be obvious to one skilled in the art that the above-described method steps are the major steps in the invention, and that such things as rinsing, neutralizing, drying, etc. may be necessary and may be done between the major steps.

We have now described our invention in its preferred embodiment. Slight variations may be made to this embodiment and still retain the spirit and scope of our invention. For example, although we have described our process as continuous, it may also be used to advantage in a batch process, with our preferred substrate or other substrates such as FR-4. Moreover, if the FR-4 board material were to be taken from a continuous roll rather than as precut panels, our continuous process could be used to advantage in a continuous process with FR-4. This has not been done before because of fears that the FR-4 is too rigid to undergo bending into a roll. This fear is unfounded. We have bent 4 mil thick FR-4 down to a 1 inch diameter and have been unable to detect fiber breakage or crazing of the material. This 1 inch diameter is well below any diameter which may be used for either coiling the material into a roll and any roll diameter encountered in a continuous process.

We claim:

1. A method of making a printed circuit board on a substrate strip, which consists of the major steps of:

preparing said substrate;

sputtering a ¼ micron base metal coating of copper onto at least one side of said substrate;

applying a photoresist to said copper coating;

exposing said photoresist in a pattern, developing said photoresist to remove the unexposed portions of said substrate and consequently to bare the sputtered copper coating therebeneath;

copper pattern plating a ½ mil layer of copper onto the bared portions of the sputtered coating of copper;

pattern plating a ½ mil layer of tin-lead onto said ½ rail copper later, said tin-lead layer acting as an etch resistant mask;

stripping the photoresist;

etching to remove the sputtered ¼ micron copper coating in those regions where the photoresist has been stripped;

stripping the tin-lead layer; and cutting said strip to the desired board size.

2. The method as set forth in claim 1 wherein the step of stripping the tin lead layer is ommitted and reflow of this layer is done instead.

3. The method as set forth in claim 1 wherein said substrate is continuous.

4. The method as set forth in claim 2 wherein said substrate is continuous.

* * * * *